US012720828B2

(12) United States Patent
Watanabe et al.

(10) Patent No.: US 12,720,828 B2
(45) Date of Patent: Aug. 25, 2026

(54) SEMICONDUCTOR FILM

(71) Applicant: NGK INSULATORS, LTD., Nagoya-City (JP)

(72) Inventors: Morimichi Watanabe, Nagoya-City (JP); Hiroshi Fukui, Obu-City (JP)

(73) Assignee: NGK INSULATORS, LTD., Nagoya-City (JP)

( * ) Notice: Subject to any disclaimer, the term of this patent is extended or adjusted under 35 U.S.C. 154(b) by 312 days.

(21) Appl. No.: 17/467,943

(22) Filed: Sep. 7, 2021

(65) Prior Publication Data

US 2021/0408242 A1 Dec. 30, 2021

Related U.S. Application Data

(63) Continuation of application No. PCT/JP2019/017940, filed on Apr. 26, 2019.

(30) Foreign Application Priority Data

Mar. 28, 2019 (JP) ................................ 2019-063603

(51) Int. Cl.

*H10D 62/80* (2025.01)
*H10D 62/40* (2025.01)
*H10P 14/20* (2026.01)
*H10P 14/24* (2026.01)

(52) U.S. Cl.

CPC ............. *H10D 62/80* (2025.01); *H10D 62/40* (2025.01); *H10P 14/24* (2026.01); *H10P 14/2921* (2026.01); *H10P 14/3238* (2026.01); *H10P 14/3434* (2026.01)

(58) Field of Classification Search

CPC ..... H10D 62/80; H10D 62/40; H01L 21/0242
See application file for complete search history.

(56) References Cited

U.S. PATENT DOCUMENTS 11,150,497 B2 * 10/2021 Uno ...................... G02F 1/0305
2006/0223287 A1 * 10/2006 Ushida .................. C30B 25/183 438/483
2015/0179445 A1 * 6/2015 Sasaki ............... H01L 21/02565 257/43
2015/0225297 A1 * 8/2015 Sato ...................... C04B 35/053 204/298.13

(Continued)

FOREIGN PATENT DOCUMENTS

EP 3141635 A1 * 3/2017 ............ C23C 16/44
JP 2014-072533 A1 4/2014

(Continued)

OTHER PUBLICATIONS

JP-2016155714-A machine translation (Year: 2023).*

(Continued)

*Primary Examiner* — Vincent Wall
(74) *Attorney, Agent, or Firm* — Muncy, Geissler, Olds & Lowe, P.C.

(57) ABSTRACT

Provided is a semiconductor film having a corundum-type crystal structure composed of $\alpha$-$Ga_2O_3$ or an $\alpha$-$Ga_2O_3$ solid solution, and an impurity concentration and/or a heterogeneous phase amount differ between a front surface and a rear surface of the semiconductor film.

3 Claims, 2 Drawing Sheets

(56) References Cited

U.S. PATENT DOCUMENTS

| | | | | |
|---|---|---|---|---|
| 2015/0260065 | A1* | 9/2015 | Kikuchi | C04B 35/117 428/117 |
| 2015/0260067 | A1* | 9/2015 | Kikuchi | B01J 35/56 427/244 |
| 2016/0149005 | A1* | 5/2016 | Oda | C01G 15/006 117/88 |
| 2017/0022238 | A1* | 1/2017 | Hara | B01J 35/30 |
| 2017/0213918 | A1* | 7/2017 | Sasaki | H01L 29/872 |
| 2017/0278933 | A1* | 9/2017 | Sasaki | H01L 29/105 |
| 2017/0288061 | A1* | 10/2017 | Sasaki | H01L 29/78 |
| 2020/0083332 | A1* | 3/2020 | Lee | H01L 21/02565 |
| 2021/0013314 | A1* | 1/2021 | Hu | H01L 29/24 |
| 2022/0069167 | A1* | 3/2022 | Lee | H01L 33/382 |
| 2022/0162768 | A1* | 5/2022 | Yoshikawa | C30B 29/16 |
| 2023/0122462 | A1* | 4/2023 | Yoshikawa | C30B 7/10 428/402 |

FOREIGN PATENT DOCUMENTS

| | | | | |
|---|---|---|---|---|
| JP | 2015-017027 | A1 | | 1/2015 |
| JP | 2015-196603 | A1 | | 11/2015 |
| JP | 2015196603 | A | * | 11/2015 |
| JP | 2016-025256 | A1 | | 2/2016 |
| JP | 2016-155714 | A1 | | 9/2016 |
| JP | 2016155714 | A | * | 9/2016 |

OTHER PUBLICATIONS

JP-2015196603-A machine translation (Year: 2023).*

Pearton et al., "A review of Ga2O3 materials, processing, and devices.", Appl. Phys. Rev. Mar. 1, 2018; 5 (1): 011301. https://doi.org/10.1063/1.5006941. (Year: 2018).*

Jamwal et al., "Gallium Oxide Nanostructures: A Review of Synthesis, Properties and Applications. Nanomaterials." 2022; 12(12): 2061. https://doi.org/10.3390/nano12122061 (Year: 2022).*

Wikipedia, "Doping_(semiconductors)", https://en.wikipedia.org/wiki/Doping_(semiconductor) (Year: 2025).*

TMSC, part of the 2005 investor report, https://investor.tsmc.com/static/annualReports/2005/pic/E-3-3.pdf (Year: 2005).*

Vobecky et al., "Doping compensation for increased robustness of fast recovery silicon diodes", Microelectriconics reliability, 50 (2010) 32-38 (Year: 2010).*

MSE Supplies, https://www.msesupplies.com/products/mse-pro-1-cassette-qty-25-of-100-mm-n-type-p-doped-prime-grade-silicon-wafer-100-ssp-1-10-ohm-cm. (Year: 2025).*

International Search Report and Written Opinion (Application No. PCT/JP2019/017940) dated Jul. 2, 2019 (with English translation).

Jinno et al., "Reduction in Edge Dislocation Density in Corundum-Structured a-$Ga_2O_3$ Layers on Sapphire Substrates with Quasi-Graded a-$(Al,Ga)_2O_3$ Buffer Layers," *The Japan Society of Applied Physics*, Jun. 1, 2016, vol. 9, 071101-1 to 071101-4 (5 pages).

* cited by examiner

SEMICONDUCTOR FILM

CROSS-REFERENCE TO RELATED APPLICATIONS

This application is a continuation application of PCT/JP2019/017940 filed Apr. 26, 2019, which claims priority to Japanese Patent Application No. 2019-063603 filed Mar. 28, 2019, the entire contents all of which are incorporated herein by reference.

BACKGROUND OF THE INVENTION

1. Field of the Invention

The present invention relates to a semiconductor film, and more particularly, relates to an $\alpha$-$Ga_2O_3$ based semiconductor film having a distribution in an impurity concentration and/or heterogeneous phase amount.

2. Description of the Related Art

In recent years, gallium oxide ($Ga_2O_3$) has been attracting attention as a material for semiconductors. Gallium oxide is known to have five crystal forms of $\alpha$, $\beta$, $\gamma$, $\delta$, and $\varepsilon$, and among them, $\alpha$-$Ga_2O_3$, which is a semi-stable phase, has a very large band gap of 5.3 eV, and is expected as a material for power semiconductors.

For example, Patent Literature 1 (JP2014-72533A) discloses a semiconductor device including a base substrate having a corundum-type crystal structure, a semiconductor layer having a corundum-type crystal structure, and an insulating film having a corundum-type crystal structure, and describes an example in which an $\alpha$-$Ga_2O_3$ film is formed as a semiconductor layer on a sapphire substrate. Further, Patent Literature 2 (JP2016-25256A) discloses a semiconductor device including an n-type semiconductor layer containing a crystalline oxide semiconductor having a corundum structure as a main component, a p-type semiconductor layer containing an inorganic compound having a hexagonal crystal structure as a main component, and an electrode. In the examples of Patent Literature 2, it is disclosed that a diode is prepared by forming an $\alpha$-$Ga_2O_3$ film having a corundum structure which is a metastable phase as an n-type semiconductor layer and an $\alpha$-$Rh_2O_3$ film having a hexagonal crystal structure as a p-type semiconductor layer on a c-plane sapphire substrate.

It is known that, in these semiconductor devices, better characteristics can be obtained when there are fewer crystal defects in the material. In particular, since a power semiconductor is required to have excellent withstand voltage characteristics, it is desirable to reduce crystal defects. This is because the dielectric breakdown electric field characteristics depend on the number of crystal defects. However, since $\alpha$-$Ga_2O_3$ is a metastable phase, a single-crystal substrate has not been put into practical use, and the single-crystal substrate is generally formed by heteroepitaxial growth on a sapphire substrate or the like. However, in such a case, it is known that a large number of crystal defects due to the difference in lattice constant with sapphire are included. For example, Non-Patent Literature 1 (Applied Physics Express, vol. 9, pages 071101-1 to 071101-4) discloses that there are lattice mismatches of 3.54% and 4.81% in the c-axis direction and the a-axis direction, respectively, between the $\alpha$-$Ga_2O_3$ and the sapphire substrate, and defects are generated in $\alpha$-$Ga_2O_3$ due to the mismatches, and that the edge dislocation density is $7\times10^{11}$ $cm^{-2}$.

Under these circumstances, a method of forming a buffer layer between sapphire and $\alpha$-$Ga_2O_3$ layer has been reported to reduce crystal defects in $\alpha$-$Ga_2O_3$. For example, Non-Patent Literature 1 discloses an example in which edge dislocations and screw dislocations are $3\times10^8/cm^2$ and $6\times10^8/cm^2$, respectively, by introducing a $(Al_x, Ga_{1-x})_2O_3$ layer (x=0.2 to 0.9) as a buffer layer between sapphire and an $\alpha$-$Ga_2O_3$ layer.

CITATION LIST

Patent Literature

Patent Literature 1: JP2014-72533A
Patent Literature 2: JP2016-25256A

Non-Patent Literature

Non-Patent Literature 1: Riena Jinno et al., Reduction in edge dislocation density in corundum-structured $\alpha$-$Ga_2O_3$ layers on sapphire substrates with quasi-graded $\alpha$-$(Al,Ga)_2O_3$ buffer layers, Applied Physics Express, Japan, The Japan Society of Applied Physics, Jun. 1, 2016, vol. 9, pages 071101-1 to 071101-4

SUMMARY OF THE INVENTION

However, since power semiconductors are required to have a high withstand voltage, the method of introducing a buffer layer as disclosed in Non-Patent Literature 1 also results in insufficient dielectric breakdown electric field characteristics, and further reduction of crystal defects is required.

The present inventors have now found that an $\alpha$-$Ga_2O_3$ based semiconductor film having remarkably few crystal defects can be provided by making the impurity concentration and/or the heterogeneous phase amount of the $\alpha$-$Ga_2O_3$ based semiconductor film different between the front surface and rear surface.

Therefore, an object of the present invention is to provide a semiconductor film having remarkably few crystal defects and exhibiting high dielectric breakdown electric field characteristics.

According to the present invention, there is provided a semiconductor film having a corundum-type crystal structure composed of $\alpha$-$Ga_2O_3$ or an $\alpha$-$Ga_2O_3$ solid solution, wherein an impurity concentration and/or a heterogeneous phase amount differ between a front surface and a rear surface of the semiconductor film.

DETAILED DESCRIPTION OF THE INVENTION

Semiconductor Film

Figure 1:
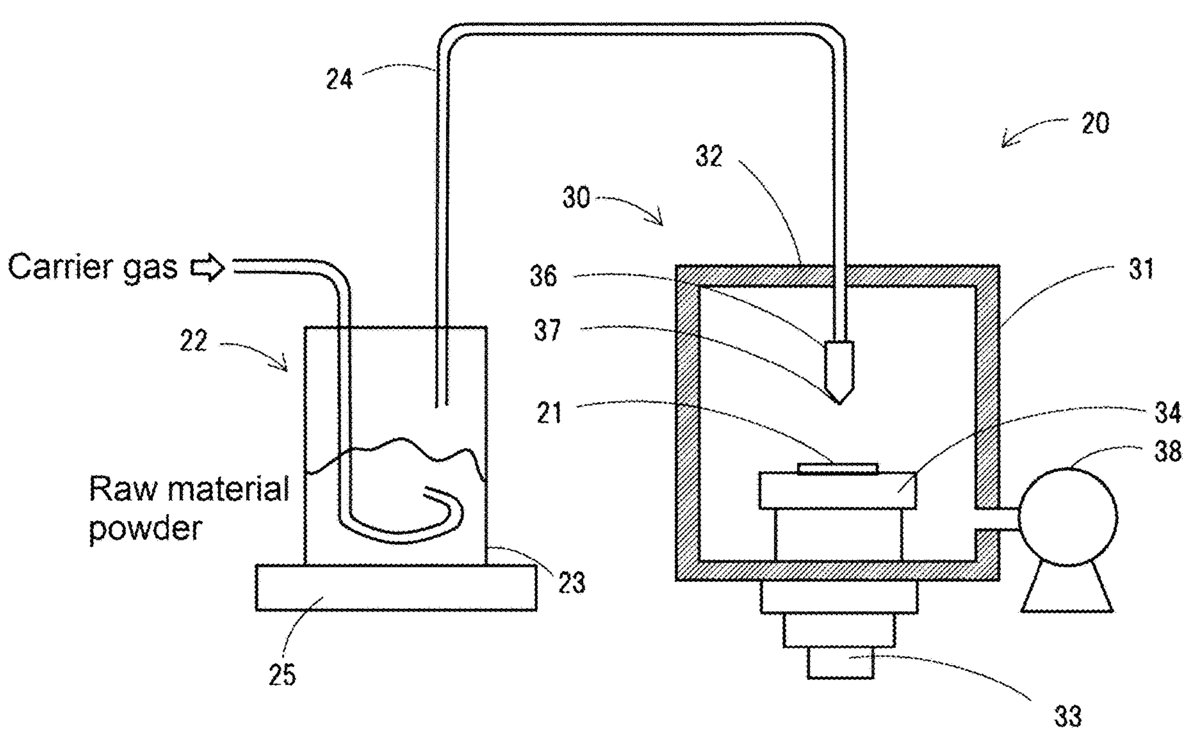
FIG. 1 is a schematic cross-sectional view showing a configuration of an aerosol deposition (AD) apparatus.

The semiconductor film of the present invention has a corundum-type crystal structure composed of $\alpha$-$Ga_2O_3$ or an $\alpha$-$Ga_2O_3$ solid solution. $\alpha$-$Ga_2O_3$ belongs to a trigonal crystal group and has a corundum-type crystal structure. Further, the $\alpha$-$Ga_2O_3$ solid solution is a solid solution in which other components are dissolved in $\alpha$-$Ga_2O_3$, and the corundum-type crystal structure is maintained.

In the $\alpha$-$Ga_2O_3$ based semiconductor film of the present invention, the impurity concentration and/or the heterogeneous phase amount are different between the front surface and the rear surface thereof. By doing so, it is possible to obtain a semiconductor film having a remarkably low density of crystal defects that reach the film surface. The crystal defect density on the surface of the semiconductor film on the side having a lower impurity concentration and/or a smaller heterogeneous phase amount is preferably $1.0\times10^6$/cm$^2$ or less, and more preferably $4.0\times10^3$/cm$^2$ or less. The lower limit of the crystal defect density is not particularly limited and is preferably low. In the present specification, the crystal defects refer to threading edge dislocations, threading screw dislocations, threading mixed dislocations, and basal plane dislocations, and the crystal defect density is the total of the dislocation densities. The basal plane dislocation is a problem in a case where the semiconductor film has an off-angle, and is not a problem because the surface of the semiconductor film is not exposed in a case where there is no off-angle. For example, when the threading edge dislocations are $3\times10^4$/cm$^2$, the threading screw dislocations are $6\times10^4$/cm$^2$, and the threading mixed dislocations are $4\times10^4$/cm$^2$, the crystal defect density becomes $1.3\times10^5$/cm$^2$.

The present inventors have found that the density of crystal defects that reach the surface on the side of the semiconductor film having a lower impurity concentration or a smaller heterogeneous phase amount is reduced by making the impurity concentration and/or the heterogeneous phase amount different between the front surface and rear surface of the semiconductor film. The reason is not clear, but the following mechanism can be considered. That is, one of the causes of defects is considered to be a lattice mismatch between the semiconductor film and the base substrate for film formation. At this time, it is considered that due to the distribution of the impurity concentration and/or heterogeneous phase amount in the thickness direction in the film, the stress of lattice mismatch in the film is relaxed and the defect density can be reduced. Alternatively, it is considered that pair annihilation between defects is likely to occur. The second cause of defects is considered to be the presence of defects in the base substrate for film formation and the defects propagating to the semiconductor film. At this time, it is considered that due to the distribution of the impurity concentration and/or heterogeneous phase amount in the thickness direction in the film, the pair annihilation between defects is likely to occur. The third cause of defects is considered to be thermal stress due to the temperature distribution during film formation or when the temperature is lowered to room temperature after film formation. At this time, it is considered that due to the distribution of the impurity concentration and/or heterogeneous phase amount in the thickness direction in the film, the thermal stress is relaxed and the formation of new dislocations can be suppressed.

Impurities contained in the semiconductor film and having different concentrations between the front surface and the rear surface preferably contain one or more components selected mainly from the group consisting of Cr, Fe and Ti. In other words, it is preferable that the total concentration of one or more components selected from the group consisting of Cr, Fe and Ti differs between the front surface and the rear surface of the semiconductor film. The heterogeneous phase contained in the semiconductor film and having different contents on the front surface and the rear surface preferably has one or more crystal structures selected from the group consisting of $\beta$-$Ga_2O_3$, $\varepsilon$-$Ga_2O_3$, $\gamma$-$Ga_2O_3$, and $\delta$-$Ga_2O_3$, and more preferably has one or more crystal structures of $\beta$-$Ga_2O_3$ and $\varepsilon$-$Ga_2O_3$.

The semiconductor film can contain a Group 14 element as a dopant at a proportion of $1.0\times10^{16}$ to $1.0\times10^{21}$/cm$^3$. Here, the term “Group 14 element” refers to a Group 14 element according to the periodic table formulated by the IUPAC (International Union of Pure and Applied Chemistry), and specifically, is any one of carbon (C), silicon (Si), germanium (Ge), tin (Sn) and lead (Pb). The amount of the dopant can be appropriately changed according to the desired characteristics, but is preferably $1.0\times10^{16}$ to $1.0\times10^{21}$/cm$^3$, and more preferably $1.0\times10^{17}$ to $1.0\times10^{19}$/cm$^3$. It is preferable that these dopants are uniformly distributed in the film and the concentrations on the front surface and the rear surface are about the same. That is, it is preferable that the semiconductor film uniformly contains the Group 14 element as the dopant in the above proportion.

Further, it is preferable that the semiconductor film is an orientation film crystallographically oriented in a specific plane orientation. The orientation of the semiconductor film can be examined by a known method, for example, by performing reverse pole figure orientation mapping using, an electron backscatter diffraction apparatus (EBSD).

The film thickness of the semiconductor film may be appropriately adjusted from the viewpoint of cost and required characteristics. That is, it takes time to form a film when the film to be formed is too thick, so it is preferable that the film is not extremely thick from the viewpoint of cost. Further, in a case where a device that requires a particularly high dielectric strength is prepared, it is preferable to prepare a thick film. On the other hand, in a case where a device that requires conductivity in the vertical direction (thickness direction) is prepared, it is preferable to prepare a thin film. As described above, the film thickness may be appropriately adjusted according to the desired characteristics, but is typically 0.1 to 50 μm, 0.2 to 20 μm, or 0.2 to 10 μm. By setting the thickness in such a range, it is possible to achieve both cost and semiconductor characteristics. In a case where a self-standing semiconductor film is required, a thick film may be used, for example, 50 μm or more, or 100 μm or more, and there is no particular upper limit unless there is a cost limitation.

The semiconductor film has an area of preferably 20 cm$^2$ or more, more preferably 70 cm$^2$ or more, and still more preferably 170 cm$^2$ or more on one side thereof. By increasing the area of the semiconductor film in this way, it is possible to obtain a large number of semiconductor elements from one semiconductor film, and it is possible to reduce the manufacturing cost. The upper limit of the size of the semiconductor film is not particularly limited, but is typically 700 cm$^2$ or less on one side.

The semiconductor film may be in the form of a self-standing film of a single film or may be formed on a support substrate. The support substrate is preferably a substrate having a corundum structure and oriented in two axes, the c-axis and the a-axis (biaxial orientation substrate). By using a biaxial orientation substrate having a corundum structure as the support substrate, the semiconductor film can also serve as a seed crystal for heteroepitaxial growth. The biaxial orientation substrate may be a polycrystal, a mosaic crystal (a set of crystals of which crystal orientations are slightly deviated), or a single-crystal. As long as it has a corundum structure, it may be composed of a single material or a solid solution of a plurality of materials. The main component of the support substrate is preferably a material selected from the group consisting of α-$Al_2O_3$, α-$Cr_2O_3$, α-$Fe_2O_3$, α-$Ti_2O_3$, α-$V_2O_3$, and α-$Rh_2O_3$, or a solid solution containing two or more selected from the group consisting of α-$Al_2O_3$, α-$Cr_2O_3$, α-$Fe_2O_3$, α-$Ti_2O_3$, α-$V_2O_3$, and α-$Rh_2O_3$, and particularly preferably α-$Cr_2O_3$, or a solid solution of α-$Cr_2O_3$ and a different material.

Further, as a seed crystal for support substrate and heteroepitaxial growth, a composite base substrate in which an orientation layer composed of a material having a corundum-type crystal structure having an a-axis length and/or a c-axis length larger than that of sapphire is formed on a corundum single crystal such as sapphire or $Cr_2O_3$ can be used. The orientation layer contains a material selected from the group consisting of α-$Cr_2O_3$, α-$Fe_2O_3$, α-$Ti_2O_3$, α-$V_2O_3$, and α-$Rh_2O_3$, or a solid solution containing two or more selected from the group consisting of α-$Al_2O_3$, α-$Cr_2O_3$, α-$Fe_2O_3$, α-$Ti_2O_3$, α-$V_2O_3$, and α-$Rh_2O_3$.

Further, the semiconductor film prepared on the base substrate for film formation may be separated and reprinted on another support substrate. The material of the other support substrate is not particularly limited, but a suitable material may be selected from the viewpoint of material properties. For example, from the viewpoint of thermal conductivity, a metal substrate made of Cu or the like, a ceramic substrate made of SiC, AlN or the like, is preferably used. It is also preferable to use a substrate having a coefficient of thermal expansion of 6 to 13 ppm/K at 25 to 400° C. By using a support substrate having such a coefficient of thermal expansion, the difference in thermal expansion between the semiconductor film and the support substrate can be reduced, and as a result, the occurrence of cracks in the semiconductor film due to thermal stress and the peeling of the film can be suppressed. An example of such a support substrate is a substrate made of a Cu—Mo composite metal. The composite ratio of Cu and Mo can be appropriately selected in consideration of the matching of the coefficient of thermal expansion with the semiconductor film, the thermal conductivity, the conductivity and the like.

The supporting substrate for the semiconductor film is preferably any of a biaxial orientation substrate composed of α-$Cr_2O_3$ or a solid solution of α-$Cr_2O_3$ and a different material, or a composite substrate having an orientation layer composed of α-$Cr_2O_3$ or a solid solution of α-$Cr_2O_3$ and a different material. By doing so, the semiconductor film can also serve as both a seed crystal (base substrate for film formation) for heteroepitaxial growth and a support substrate, and the crystal defects in the semiconductor film can also be significantly reduced.

As described above, the semiconductor film of the present invention has remarkably few crystal defects and can exhibit high dielectric breakdown electric field characteristics. As far as the present inventor knows, a technique for obtaining a semiconductor film having such a low crystal defect density has not been conventionally known. For example, Non-Patent Literature 1 discloses that an α-$Ga_2O_3$ layer is formed using a substrate in which a $(Al_x, Ga_{1-x})_2O_3$ layer (x=0.2 to 0.9) is introduced as a buffer layer between sapphire and the α-$Ga_2O_3$ layer, and in the obtained α-$Ga_2O_3$ layer, the densities of edge dislocations and screw dislocations are $3\times10^8$/cm$^2$ and $6\times10^3$/cm$^2$, respectively.

Method for Producing Semiconductor Film

A method of producing the semiconductor film is not particularly limited as long as the film can be formed so that the impurity concentration and/or the heterogeneous phase amount differs between the front surface and the rear surface. However, as described above, it is preferable to use any of a biaxial orientation substrate composed of α-$Cr_2O_3$ or a solid solution of α-$Cr_2O_3$ and a different material, or a composite base substrate having an orientation layer composed of α-$Cr_2O_3$ or a solid solution of α-$Cr_2O_3$ and a different material, as a base substrate for film formation. Hereinafter, the method for producing the semiconductor film will be described in the order of (1) preparation of a composite base substrate and (2) formation of a semiconductor film.

(1) Preparation of Composite Base Substrate

The composite base substrate can be preferably produced by (a) providing a sapphire substrate, (b) preparing a predetermined orientation precursor layer, (c) performing heat treatment on the orientation precursor layer on the sapphire substrate to convert at least a portion near the sapphire substrate into an orientation layer, and optionally (d) subjecting the orientation layer to processing such as grinding or polishing to expose the surface of the orientation layer. This orientation precursor layer becomes an orientation layer by heat treatment and contains a material having a corundum-type crystal structure having an a-axis length and/or c-axis length larger than that of sapphire, or a material capable of having a corundum-type crystal structure having an a-axis length and/or c-axis length larger than that of sapphire by heat treatment to be described later. Further, the orientation precursor layer may contain trace components in addition to the material having a corundum-type crystal structure. According to such a production method, the growth of the orientation layer can be promoted by using the sapphire substrate as a seed crystal. That is, the high crystallinity and crystal orientation peculiar to the single-crystal of the sapphire substrate are inherited by the orientation layer.

(a) Provision of Sapphire Substrate

To prepare the composite base substrate, first, a sapphire substrate is provided. The sapphire substrate used may have any orientation plane. That is, the sapphire substrate may have an a-plane, a c-plane, an r-plane, or an m-plane, or may have a predetermined off-angle with respect to these planes. For example, in a case where a c-plane sapphire is used, since the c-axis is oriented with respect to the surface, it is possible to easily heteroepitaxially grow a c-axis oriented orientation layer thereon. A sapphire substrate to which a dopant is added may also be used to adjust electrical properties. As such a dopant, a known dopant can be used.

(b) Preparation of Orientation Precursor Layer

An orientation precursor layer containing a material having a corundum-type crystal structure having an a-axis length and/or c-axis length larger than that of sapphire, or a material capable of having a corundum-type crystal structure having an a-axis length and/or c-axis length larger than that of sapphire by heat treatment is prepared. The method for forming the orientation precursor layer is not particularly limited, and a known method can be adopted. Examples of the method for forming the orientation precursor layer include an aerosol deposition (AD) method, a sol-gel method, a hydrothermal method, a sputtering method, an evaporation method, various chemical vapor deposition (CVD) methods, a PLD method, a chemical vapor transport (CVT) method, and a sublimation method. Examples of the CVD method include a thermal CVD method, a plasma CVD method, a mist CVD method, and an MO (metal organic) CVD method. Alternatively, a method may be used in which a molded body of the orientation precursor is prepared in advance and the molded body is placed on a sapphire substrate. Such a molded body can be produced by molding the material of the orientation precursor by a method such as tape casting or press molding. Further, it is also possible to use a method in which a polycrystal prepared in advance by various CVD methods, sintering, or the like is used as the orientation precursor layer and is placed on a sapphire substrate.

However, a method of directly forming the orientation precursor layer by using an aerosol deposition (AD) method, various CVD methods, or a sputtering method is preferred. By using these methods, a dense orientation precursor layer can be formed in a relatively short time, and heteroepitaxial growth using a sapphire substrate as a seed crystal can be easily caused. In particular, the AD method does not require a high vacuum process and has a relatively high film formation rate, and is therefore preferable in terms of production cost. In the case of using a sputtering method, a film can be formed using a target of the same material as that of the orientation precursor layer, but a reactive sputtering method in which a film is formed in an oxygen atmosphere using a metal target can also be used. A method of placing a molded body prepared in advance on sapphire is also preferable as a simple method, but since the orientation precursor layer is not dense, a process of densification is required in the heat treatment step described later. In the method of using a polycrystalline prepared in advance as an orientation precursor layer, two steps of a step of preparing a polycrystalline body and a step of performing heat treatment on a sapphire substrate are required. Further, in order to improve the adhesion between the polycrystal and the sapphire substrate, it is necessary to take measures such as keeping the surface of the polycrystal sufficiently smooth. Although known conditions can be used for any of the methods, a method of directly forming an orientation precursor layer using an AD method and a method of placing a molded body prepared in advance on a sapphire substrate will be described below.

The AD method is a technique for forming a film by mixing fine particles or a fine particle raw material with a gas to form an aerosol, and impacting the aerosol on a substrate by injecting the aerosol at a high speed from a nozzle, and has a feature of forming a film densified at ordinary temperature. FIG. 1 shows an example of a film forming apparatus (aerosol deposition (AD) apparatus) used in such an AD method. The film forming apparatus 20 shown in FIG. 1 is configured as an apparatus used in an AD method in which a raw material powder is injected onto a substrate in an atmosphere having a pressure lower than atmospheric pressure. The film forming apparatus 20 includes an aerosol generating unit 22 that generates an aerosol of raw material powder containing raw material components, and a film forming unit 30 that forms a film containing the raw material components by injecting the raw material powder onto the sapphire substrate 21. The aerosol generating unit 22 includes an aerosol generating chamber 23 that stores raw material powder and receives a carrier gas supply from a gas cylinder (not shown) to generate an aerosol, and a raw material supply pipe 24 that supplies the generated aerosol to the film forming unit 30, and a vibrator 25 that applies vibration at frequencies of 10 to 100 Hz to the aerosol generating chamber 23 and the aerosol therein. The film forming unit 30 has a film forming chamber 32 that injects aerosols onto the sapphire substrate 21, a substrate holder 34 that is disposed inside the film forming chamber 32 and fixes the sapphire substrate 21, and an X-Y stage 33 that moves the substrate holder 34 in the X-Y axis direction. Further, the film forming unit 30 includes an injection nozzle 36 in which a slit 37 is formed at a tip thereof to inject aerosol into the sapphire substrate 21, and a vacuum pump 38 for reducing the pressure in the film forming chamber 32.

It is known that the AD method can control a film thickness, a film quality, and the like according to film forming conditions. For example, the form of the AD film is easily affected by the collision rate of the raw material powder to the substrate, the particle size of the raw material powder, the aggregated state of the raw material powder in the aerosol, the injection amount per unit time, and the like. The collision rate of the raw material powder with the substrate is affected by the differential pressure between the film forming chamber 32 and the injection nozzle 36, the opening area of the injection nozzle, and the like. If appropriate conditions are not used, the coating may become a green compact or generate pores, so it is necessary to appropriately control these factors.

In a case where a molded body in which the orientation precursor layer is prepared in advance is used, the raw material powder of the orientation precursor can be molded to prepare the molded body. For example, in a case where press molding is used, the orientation precursor layer is a press molded body. The press molded body can be prepared by press-molding the raw material powder of the orientation precursor based on a known method, and may be prepared, for example, by placing the raw material powder in a mold and pressing the raw material powder at pressures of preferably 100 to 400 $kgf/cm^2$, and more preferably 150 to 300 $kgf/cm^2$. The molding method is not particularly limited, and in addition to press molding, tape casting, slip casting, extrusion molding, doctor blade method, and any combination thereof can be used. For example, in the case of using tape casting, it is preferable that additives such as a binder, a plasticizer, a dispersant, and a dispersion medium are appropriately added to the raw material powder to form a slurry, and the slurry is discharged and molded into a sheet shape by passing through a slit-shaped thin discharge port. The thickness of the molded body formed into a sheet is not limited, but is preferably 5 to 500 μm from the viewpoint of handling. Further, in a case where a thick orientation precursor layer is required, a large number of these sheet molded bodies may be stacked and used as a desired thickness.

In these molded bodies, the portion near the sapphire substrate becomes an orientation layer by the subsequent heat treatment on the sapphire substrate. As described above, in such a method, it is necessary to sinter and densify the molded body in the heat treatment step described later. Therefore, the molded body may contain trace components such as a sintering aid in addition to the material having or resulting in a corundum-type crystal structure.

(c) Heat Treatment of Orientation Precursor Layer on Sapphire Substrate

A heat treatment is performed on the sapphire substrate on which the orientation precursor layer is formed at a temperature of 1000° C. or greater. By this heat treatment, at least a portion of the orientation precursor layer near the sapphire substrate can be converted into a dense orientation layer. Further, this heat treatment enables heteroepitaxial growth of the orientation layer. That is, by forming the orientation layer with a material having a corundum-type crystal structure, heteroepitaxial growth occurs in which the material having a corundum-type crystal structure crystal grows using a sapphire substrate as a seed crystal during heat treatment. At that time, the crystals are rearranged, and the crystals are arranged according to the crystal plane of the sapphire substrate. As a result, the crystal axes of the sapphire substrate and the orientation layer can be aligned.

For example, when a c-plane sapphire substrate is used, both the sapphire substrate and the orientation layer can be c-axis oriented with respect to the surface of the base substrate. Moreover, this heat treatment makes it possible to form a gradient composition region in a part of the orientation layer. That is, during the heat treatment, a reaction occurs at the interface between the sapphire substrate and the orientation precursor layer, and the Al component in the sapphire substrate diffuses into the orientation precursor layer, and/or the component in the orientation precursor layer diffuses into the sapphire substrate, thereby forming a gradient composition region composed of a solid solution containing $\alpha$-$Al_2O_3$.

It is known that methods such as various CVD methods, a sputtering method, a PLD method, a CVT method, and a sublimation method may cause heteroepitaxial growth on a sapphire substrate without heat treatment at 1000° C. or greater. However, it is preferable that the orientation precursor layer is in a non-oriented state, that is, amorphous or non-oriented polycrystalline, at the time of preparation thereof, and the crystal rearrangement is caused by using sapphire as a seed crystal at the time of the heat treatment step. By doing so, it is possible to effectively reduce the crystal defects that reach the front surface of the orientation layer. The reason for this is not clear, but it is considered that the crystal structure of the solid-phase orientation precursor layer once formed may be rearranged using sapphire as a seed, which may also be effective in eliminating crystal defects.

The heat treatment is not particularly limited as long as a corundum-type crystal structure is obtained and heteroepitaxial growth using a sapphire substrate as a seed occurs, and can be performed in a known heat treatment furnace such as a tubular furnace or a hot plate. Further, in addition to the heat treatment under normal pressure (without pressing), a heat treatment under pressure such as hot pressing or HIP, or a combination of a heat treatment under normal pressure and a heat treatment under pressure can also be used. The heat treatment conditions can be appropriately selected depending on the material used for the orientation layer. For example, the atmosphere of the heat treatment can be selected from the air, vacuum, nitrogen and inert gas atmosphere. The preferred heat treatment temperature also varies depending on the material used for the orientation layer, but is preferably 1000 to 2000° C., and more preferably 1200 to 2000° C., for example. The heat treatment temperature and the retention time are related to the thickness of the orientation layer formed by heteroepitaxial growth and the thickness of the gradient composition region formed by diffusion with the sapphire substrate, and can be appropriately adjusted depending on the kind of the material, the target orientation layer, the thickness of the gradient composition region, and the like. However, in the case of using molded body prepared in advance is used as the orientation precursor layer, it is necessary to perform sintering and densification during heat treatment, and normal pressure firing at a high temperature, hot pressing, HIP, or a combination thereof is suitable. For example, when using a hot press, the surface pressure is preferably 50 $kgf/cm^2$ or more, more preferably 100 $kgf/cm^2$ or more, particularly preferably 200 $kgf/cm^2$ or more, the upper limit is not particularly limited. The firing temperature is also not particularly limited as long as sintering, densification, and heteroepitaxial growth occur, but is preferably 1000° C. or greater, more preferably 1200° C. or greater, still more preferably 1400° C. or greater, and particularly preferably 1600° C. or greater. The firing atmosphere can also be selected from atmosphere, vacuum, nitrogen and an inert gas atmosphere. As the firing jig such as a mold, those made of graphite or alumina can be used.

(d) Exposure of Surface of Orientation Layer

On the orientation layer formed near the sapphire substrate by the heat treatment, an orientation precursor layer or a surface layer having poor orientation or no orientation may exist or remain. In this case, it is preferable that the surface derived from the orientation precursor layer is subjected to processing such as grinding or polishing to expose the surface of the orientation layer. By doing so, a material having excellent orientation is exposed on the surface of the orientation layer, so that the semiconductor layer can be effectively epitaxially grown on the material. The method for removing the orientation precursor layer and the surface layer is not particularly limited, and examples thereof include a method for grinding and polishing and a method for ion beam milling. The surface of the orientation layer is preferably polished by lapping using abrasive grains or chemical mechanical polishing (CMP).

(2) Formation of Semiconductor Film

Next, a semiconductor film is formed on the orientation layer of the obtained composite base substrate. As for the method of forming a semiconductor film, as long as the semiconductor film having the characteristics specified in the present invention can be obtained, in other words, as long as the film can be formed so that the impurity concentration and/or the heterogeneous phase amount are different between the front surface and the rear surface, known methods can be used. However, any of the mist CVD method, HVPE method, MBE method, MOCVD method, hydrothermal method and sputtering method is preferable, and the mist CVD method, hydrothermal method or HVPE method is particularly preferable. Among these methods, the HVPE method will be described below.

The HVPE method (halide vapor phase epitaxy method) is a type of CVD and is a method applicable to film formation of compound semiconductors such as $Ga_2O_3$ and GaN. In this method, the Ga raw material and the halide are reacted to generate gallium halide gas, which is supplied onto the base substrate for film formation. At the same time, $O_2$ gas is supplied onto the base substrate for film formation, and the reaction between the gallium halide gas and the $O_2$ gas causes $Ga_2O_3$ to grow on the base substrate for film formation. This method has been widely used industrially due to its high speed and thick film growth capability, and examples of film formation of not only $\alpha$-$Ga_2O_3$ but also $\beta$-$Ga_2O_3$ have been reported.

Figure 2:
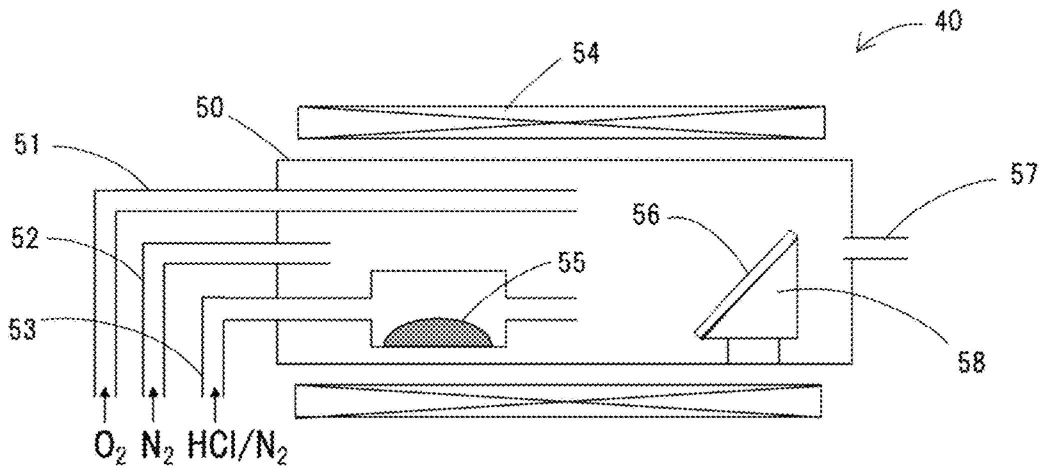
FIG. 2 is a schematic cross-sectional view showing a configuration of a vapor deposition apparatus using a HVPE method.
Figure 3:
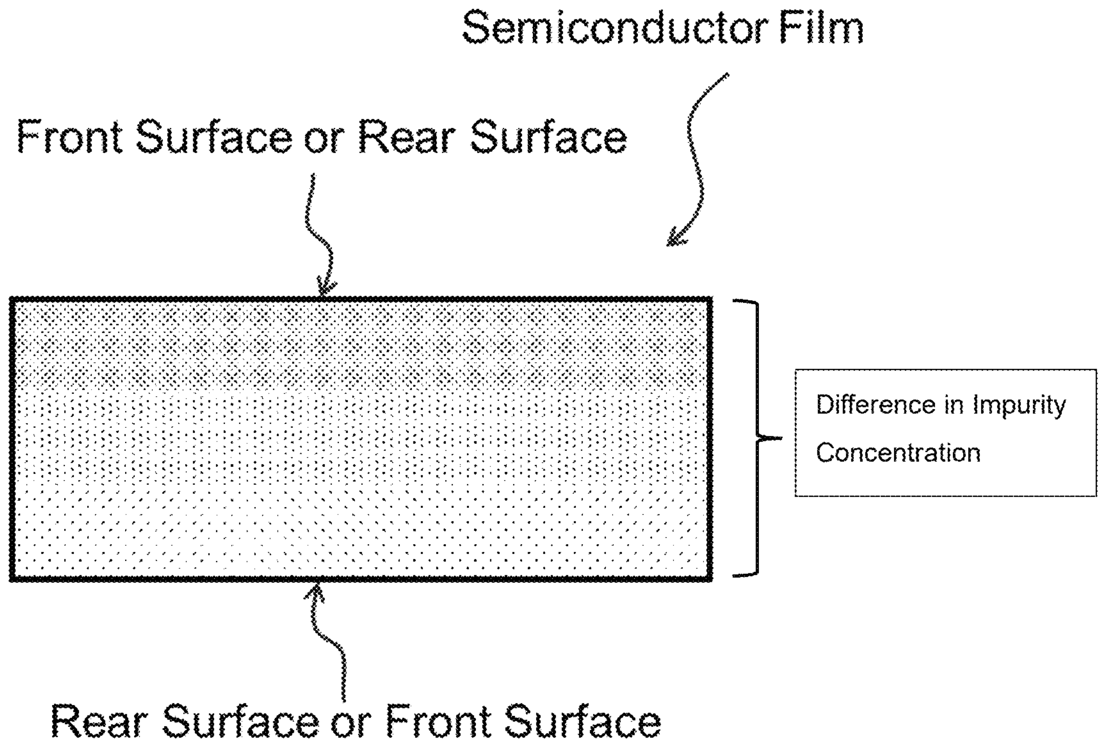
FIG. 3 is a schematic cross-sectional view conceptually illustrating an embodiment of a semiconductor film according to the present invention.

FIG. 2 shows an example of a vapor deposition apparatus using a HVPE method. A vapor deposition apparatus 40 using the HVPE method includes a reaction furnace 50, a susceptor 58 on which a base substrate for film formation 56 is placed, an oxygen raw material supply source 51, a carrier gas supply source 52, and a Ga raw material supply source 53, a heater 54, and a gas discharge unit 57. The reactor 50 may be any reactor that does not react with the raw material, such as a quartz tube. The heater 54 may be any heater capable of heating up to at least 700° C. (preferably 900° C. or higher), for example, a resistance heating type heater.

A metal Ga 55 is placed inside the Ga raw material supply source 53, and a halogen gas or a hydrogen halide gas, for example, HCl is supplied. The halogen gas or halogenated gas is preferably $Cl_2$ or HCl. The supplied halogen gas or halogenated gas reacts with the metal Ga 55 to generate gallium halide gas, which is supplied to the base substrate for film formation. The gallium halide gas preferably contains GaCl and/or $GaCl_3$. The oxygen raw material supply source 51 can supply an oxygen source selected from the group consisting of $O_2$, $H_2O$ and $N_2O$, and $O_2$ is preferable. These oxygen raw material gases are supplied to the base substrate for film formation for film formation at the same time as the gallium halide gas. The Ga raw material and the oxygen raw material gas may be supplied together with a carrier gas such as $N_2$ or a rare gas.

The gas discharge unit 57 may be connected to a vacuum pump such as a diffusion pump or a rotary pump, for example, and may control not only the discharge of unreacted gas in the reaction furnace 50 but also the inside of the reaction furnace 50 under reduced pressure. This can suppress the gas phase reaction and improve the growth rate distribution.

By heating the base substrate for film formation 56 to a predetermined temperature using the heater 54 and simultaneously supplying the gallium halide gas and the oxygen raw material gas, $\alpha$-$Ga_2O_3$ is formed on the base substrate for film formation 56. The film formation temperature is not particularly limited as long as $\alpha$-$Ga_2O_3$ is formed, but is typically 250° C. to 900° C., for example. The partial pressure of the Ga raw material gas and the oxygen raw material gas is also not particularly limited. For example, the partial pressure of the Ga raw material gas (gallium halide gas) may be in the range of 0.05 kPa or more and 10 kPa or less, and the partial pressure of the oxygen raw material gas may be in the range of 0.25 kPa or more and 50 kPa or less.

In a case where impurities containing one or more selected from Cr, Fe and Ti are added to the semiconductor film, these halides may be supplied from a separate supply source, or these halides may be mixed and supplied from the Ga raw material supply source 53. Further, a material containing these metal elements may be placed in the same place as the metal Ga 55, reacted with a halogen gas or a hydrogen halide gas, and supplied as a halide. In a case where an $\alpha$-$Ga_2O_3$ based semiconductor film containing a Group 14 element is formed, or in the case where a mixed crystal film with $\alpha$-$Ga_2O_3$ containing an oxide of In or Al or the like is formed as a dopant, these halides may be supplied from a separate supply source, or these halides may be mixed and supplied from the Ga raw material supply source 53. Further, a material containing a Group 14 element, In, Al or the like may be placed in the same place as the metal Ga 55, reacted with a halogen gas or a hydrogen halide gas, and supplied as a halide. These halide gas supplied to the base substrate for film formation 56 react with the oxygen raw material gas to form oxides in the same manner as gallium halide, and are incorporated into the $\alpha$-$Ga_2O_3$ based semiconductor film.

When forming a semiconductor film by the HVPE method, it is possible to form a film having a single-layer structure by keeping the supply amounts of Ga raw material, oxygen raw material, impurity raw material, and the like constant and appropriately controlling the film forming conditions. However, in the case of preparing a semiconductor film having different impurity concentrations on the front surface and the rear surface, the supply ratio of the raw material gas may be changed gradually and/or continuously during the film formation to obtain a film having a multilayer structure having different compositions. For example, it is possible to prepare a semiconductor film having a multilayer structure in which the component composition varies in the thickness direction by changing the concentration of metals such as Cr, Fe, and Ti in the raw material gas during film formation. Further, the amount of Cr, Fe, Ti, or the like incorporated into the semiconductor film also varies depending on the conditions such as the film formation temperature. Therefore, for example, it is possible to prepare a semiconductor film having a multilayer structure in which the component composition varies in the thickness direction by gradually and/or continuously changing the conditions such as the film formation temperature during the film formation. When a base substrate for film formation containing Cr, Fe, Ti, or the like as a main component is used, these impurities may be incorporated into the semiconductor film without adding the above impurities separately. The supply source of impurities is a base substrate for film formation, and the base substrate for film formation reacts slightly with the film forming gas during film formation, and impurities are incorporated into the semiconductor film. Further, by appropriately adjusting various conditions such as the film formation temperature and the supply rate of the raw material, the impurity content incorporated into the semiconductor film can be controlled. Therefore, in order to prepare a film having different impurity concentrations on the front surface and the rear surface by using such a base substrate for film formation, it is required to appropriately control these factors.

In the case of preparing a semiconductor film having a different amount of heterogeneous phase amount on the front surface and the rear surface, the semiconductor film may be a film having a multilayer structure in which the content of heterogeneous phase having a crystal structure different from that of $\alpha$-$Ga_2O_3$ varies in the semiconductor film by gradually and/or continuously changing the supply ratio of the raw material gas during film formation, or by gradually and/or continuously changing various conditions such as the film formation temperature and the raw material supply rate. For example, the amount of heterogeneous phase formed can be controlled by changing the film formation temperature, the raw material supply rate, the raw material supply ratio, and the like between the initial stage and the late stage of film formation.

In this way, the semiconductor film is formed on the composite base substrate. The impurity content in the semiconductor film can be evaluated by a known analytical method such as D-SIMS, GD-MS, GD-OES, EDS, and EPMA. For example, in order to evaluate the impurity content in the semiconductor film using D-SIMS, the following method can be used.

<D-SIMS Measurement of Negative Ions>

Measurement equipment: IMS-7f manufactured by CAMECA

Primary ion species: $Cs^+$

Primary ion acceleration energy: 14.5 keV

Secondary ion polarity: Negative

Sputter cycle: 0 to 60 cycles

Evaluation of impurity content: The average value between 0 and 60 spatter cycles is taken as the impurity content.

<D-SIMS Measurement of Positive Ions>

Measuring equipment: SIMS4550 manufactured by FEI Company

Primary ion species: $O^{2+}$

Primary ion acceleration energy: 3 keV

Secondary ion polarity: Positive

Sputter cycle: 0 to 200 cycles

Evaluation of impurity content: The average value between 0 and 200 spatter cycles is taken as the impurity content.

Further, the heterogeneous phase amount in the semiconductor film can be evaluated by a known analytical method such as XRD or EBSD. For example, in order to evaluate the heterogeneous phase amount in a semiconductor film using XRD, the following method can be used.

<Evaluation of Heterogeneous Phase Amount by XRD>

Measuring equipment: RINT-TTR III manufactured by Rigaku Corporation

Measurement range: 2θ=20 to 70°

X-ray source: CuKα ray, voltage 50 kV, current 300 mA

The crystal defect density in the semiconductor film can be evaluated by a plane TEM or a cross-section TEM. For example, the following method can be used to evaluate the crystal defect density by plane TEM observation (plan view).

<Evaluation of Crystal Defect Density by Plane TEM Observation (Plan View)>

Measuring equipment: H-90001UHR-I manufactured by Hitachi.

Test piece: A test piece was cut out into ten pieces so as to include the film surface and processed by ion milling so that the measurement field of view is 50 μm×50 μm and the thickness of each test piece around the measurement field of view is 150 nm.

Acceleration voltage: 300 kV

The semiconductor film thus prepared typically has a significantly low surface crystal defect density of $1.0\times10^6$/$cm^2$ or less. Such a semiconductor layer having a remarkably low crystal defect density is excellent in dielectric breakdown electric field characteristics and is suitable for application in power semiconductors. The crystal defect density is preferably $1.0\times10^5$/$cm^2$ or less, more preferably $4.0\times10^3$/$cm^2$ or less.

The semiconductor film of the present invention has a remarkably small warpage after formed on a base substrate for film formation or when separated from the base substrate for film formation to form a self-standing film. In particular, in the case of using any of a biaxial orientation substrate composed of $\alpha$-$Cr_2O_3$ or a solid solution of $\alpha$-$Cr_2O_3$ and a different material, or a composite substrate having an orientation layer composed of $\alpha$-$Cr_2O_3$ or a solid solution of $\alpha$-$Cr_2O_3$ and a different material, as a base substrate for film formation, the warpage amount can be particularly reduced. For example, the warpage amount in a case where a 2-inch size semiconductor film is prepared can be 30 μm or less, more preferably 20 μm or less, and still more preferably 10 μm or less. The reason why such a small amount of warpage can be obtained is not clear, but it is considered that due to the distribution of the impurity concentration and/or heterogeneous phase amount in the thickness direction, the stress in the semiconductor film during film formation is relaxed.

The semiconductor film of the present invention can be a film with small mosaicity. The $\alpha$-$Ga_2O_3$ film formed on the conventional sapphire substrate may be an aggregate (mosaic crystal) of domains having slightly different crystal orientations. The cause of this is not clear, but it may be attributed to the fact that $\alpha$-$Ga_2O_3$ is a metastable phase and therefore the film formation temperature is relatively low. Since the film formation temperature is low, it is difficult for the adsorbed components to migrate on the substrate surface, thus suppressing step-flow growth. Therefore, the growth mode of island-shaped growth (three-dimensional growth) tends to be dominant. Further, in a case where a sapphire substrate is used as the base substrate for film formation, there may be a lattice mismatch between the semiconductor film and the sapphire, and each island-shaped growth part (domain) may have slightly different crystal orientation. For this reason, the domains do not meet completely and tend to form mosaic crystals. The semiconductor film of the present invention, in particular as base substrate for film formation, can be formed by using any of a single-crystal substrate composed of $\alpha$-$Cr_2O_3$ or a solid solution of $\alpha$-$Cr_2O_3$ and a different material, or a composite substrate having a single-crystal substrate composed of $\alpha$-$Cr_2O_3$ or a solid solution of $\alpha$-$Cr_2O_3$ and a different material, and in a case where the film formation conditions are properly controlled, a semiconductor film without mosaicity (that is, single-crystal) or with small mosaicity can be obtained. The reason for this is not clear, but it is considered that in addition to the fact that the lattice constant of the semiconductor film during film formation is close to or the same as that of the base substrate for film formation, due to the distribution of the impurity concentration and/or heterogeneous phase amount in the thickness direction in the film, the stress in the semiconductor film during film formation or during temperature drop after film formation is relaxed, and the orientations are easily aligned. Further, as described above, since the stress applied to the film is relaxed, the crystal structure of $\alpha$-$Ga_2O_3$ is stabilized. In other words, it is possible to maintain the crystal structure of $\alpha$-$Ga_2O_3$ and form a film even if the film formation temperature is relatively high. By forming a film at a high temperature, the adsorbed component is likely to migrate on the surface of the substrate, and step-flow growth is likely to occur. This point is also considered to be one of the factors for obtaining a semiconductor film with no mosaicity (that is, a single-crystal) or with small mosaicity. From the viewpoint of mosaicity, the film formation temperature is, for example, 600° C. or higher, preferably 700° C. or higher, more preferably 800° C. or higher, and still more preferably 900° C. or higher. In order to evaluate the mosaicity of the semiconductor film, known methods such as X-ray rocking curve measurement, EBSD measurement, and TEM can be used, but evaluation at a half width in X-ray rocking curve measurement is particularly suitable.

For example, the following method can be used to evaluate the mosaicity of the semiconductor film by X-ray rocking curve (XRC) measurement.

<Evaluation of Mosaicity by XRC>

Measuring equipment: D8-DISCOVER manufactured by Bruker-AXS

X-ray source: CuKα ray, tube voltage 40 kV, tube current 40 mA, parallel monochromatization with Ge (022) asymmetric reflection monochromator Collimator diameter: 0.5 mm Anti-scattering slit: 3 mm ω step width: 0.005°

Counting time: 0.5 seconds

XRD analysis software: "LEPTOS" Ver 4.03 manufactured by Bruker-AXS

For example, the (006) plane half width of the X-ray rocking curve is preferably less than 40 seconds, more preferably less than 30 seconds, and there is no problem with a value equivalent to the half width specific to the X-ray source used for the measurement. Further, the (104) plane half width of the X-ray rocking curve is preferably less than 40 seconds, more preferably less than 30 seconds, and there is no problem with a value equivalent to the half width specific to the X-ray source used for the measurement. Although the half width of the X-ray rocking curve is affected by the crystal defect density and crystal warpage in addition to the above-mentioned mosaicity, it is considered that such a value can be realized as the semiconductor film of the present invention has few crystal defects, shows no mosaicity, and has small warpage.

The obtained semiconductor film can be formed as it is or divided into semiconductor elements. Alternatively, the semiconductor film may be peeled off from the composite base substrate to form a single film. In this case, in order to facilitate peeling from the composite base substrate, a semiconductor film in which a peeling layer is provided in advance on the orientation layer front surface (film forming surface) of the composite base substrate may be used. Examples of such a release layer include those provided with a C injection layer and an H injection layer on the surface of the composite base substrate. Further, C or H may be injected into the film at the initial stage of film formation of the semiconductor film, and a release layer may be provided on the semiconductor film side. Furthermore, it is also possible to adhere and bond a support substrate (mounting substrate) different from the composite base substrate to the front surface of the semiconductor film formed on the composite base substrate (that is, the opposite side of the composite base substrate), and then peel and remove the composite base substrate from the semiconductor film. As such a support substrate (mounting substrate), a substrate having a coefficient of thermal expansion at 25 to 400° C. of 6 to 13 ppm/K, for example, a substrate composed of a Cu—Mo composite metal can be used. Further, example of the method of adhering and bonding the semiconductor film and the support substrate (mounting substrate) include known methods such as brazing, soldering, and solid phase bonding. Further, an electrode such as an ohmic electrode or a Schottky electrode, or another layer such as an adhesive layer may be provided between the semiconductor film and the support substrate.

What is claimed is:

1. A semiconductor film having a corundum-type crystal structure composed of $\alpha$-$Ga_2O_3$ or an $\alpha$-$Ga_2O_3$ solid solution, wherein an impurity concentration amount differs between a front surface and a rear surface of the semiconductor film, and wherein the impurity concentration has a distribution in the thickness direction in the semiconductor film, wherein impurities contained in the semiconductor film include one or more components selected from the group consisting of Cr and Fe, and wherein the semiconductor film uniformly contains a Group 14 element as a dopant at a proportion of $1.0\times10^{16}$ to $1.0\times10^{21}/cm^3$.

2. The semiconductor film according to claim 1, wherein a crystal defect density on a surface of the semiconductor film on a side having a lower impurity concentration is $1.0\times10^{6}/cm^2$ or less.

3. The semiconductor film according to claim 1, wherein the semiconductor film is an orientation film crystallographically oriented in a specific plane orientation.

* * * * *